(12) United States Patent
Arai

(10) Patent No.: US 8,520,190 B2
(45) Date of Patent: Aug. 27, 2013

(54) EVALUATION METHOD, CONTROL METHOD, EXPOSURE APPARATUS, AND MEMORY MEDIUM

(75) Inventor: Tadashi Arai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 959 days.

(21) Appl. No.: 12/351,019

(22) Filed: Jan. 9, 2009

(65) Prior Publication Data

US 2009/0180093 A1    Jul. 16, 2009

(30) Foreign Application Priority Data

Jan. 10, 2008  (JP) ................................ 2008-003641

(51) Int. Cl.
  G03B 27/32   (2006.01)
  G03B 27/52   (2006.01)
  G03F 7/20    (2006.01)
(52) U.S. Cl.
  CPC ................................. *G03F 7/70566* (2013.01)
  USPC ............................................. 355/77; 355/55
(58) Field of Classification Search
  CPC .......................... G03F 7/70566; G03F 7/70508
  USPC ................. 355/53, 67, 77; 356/364; 702/82
  See application file for complete search history.

(56) References Cited

U.S. PATENT DOCUMENTS

| | | | |
|---|---|---|---|
| 7,139,137 B2 | 11/2006 | Sudoh | |
| 2005/0024612 A1* | 2/2005 | Hirukawa et al. | ............... 355/55 |
| 2006/0152700 A1 | 7/2006 | Yamada | |
| 2007/0046921 A1 | 3/2007 | Takahashi et al. | |
| 2007/0182969 A1 | 8/2007 | Mengel et al. | |
| 2009/0306921 A1* | 12/2009 | Totzeck et al. | ................. 702/82 |

FOREIGN PATENT DOCUMENTS

| | | |
|---|---|---|
| JP | 2004-347821 A | 12/2004 |
| JP | 2006-173305 A | 6/2006 |
| JP | 2006-237109 A | 9/2006 |
| JP | 2007-194551 A | 8/2007 |
| JP | 2007-212455 A | 8/2007 |

OTHER PUBLICATIONS

McIntyre et al., Polarization aberrations in hyper-numerical-aperture projection printing: a comparison of various representations, Jul.-Sep. 2006, J. Microlith., Microfab., Microsyst., vol. 5(3).*

(Continued)

*Primary Examiner* — Steven H Whitesell Gordon

(74) *Attorney, Agent, or Firm* — Canon U.S.A., Inc. IP Division

(57) ABSTRACT

A method of evaluating an imaging performance of a projection optical system, comprising a step of specifying a polarization change of the projection optical system, which represents a relationship between a polarization state of light impinging on the projection optical system and the polarization state of the light exiting from the projection optical system, a first calculation step of calculating a value of a parameter having a correlation with the polarization change of the projection optical system specified in the specifying step, and a second calculation step of calculating an index value representing the imaging performance in a state that the projection optical system has the polarization change specified in the specifying step, based on an amount of change in the index value representing the imaging performance upon changing the value of the parameter by a unit amount, and the value of the parameter calculated in the first calculation step.

9 Claims, 5 Drawing Sheets

(56) References Cited

OTHER PUBLICATIONS

Arai et al., Optimization Procedure of Exposure Tools with Polarization Aberrations, 2008, Optical Microlithography XXI Proc. of SPIE vol. 6924.*

Yamamoto et al., Polarization Aberration Analysis Using Pauli-Zernike Representation, 2007, Optical Microlithography XX Proc. of SPIE vol. 6520.*

Geh, B., et al., "The impact of projection lens polarization properties on lithographic process at hyper-NA", Optical Microlithography XX, 2007, SPIE—Int. Soc. Opt. Eng. vol. 6520, p. 6520-15.*

McGuire, J.P., Jr. and R.A. Chipman, "Polarization aberrations. 1. Rotationally symmetric optical systems", Applied Optics, 1994, 33(22), p. 5080-5100.*

* cited by examiner

EVALUATION METHOD, CONTROL METHOD, EXPOSURE APPARATUS, AND MEMORY MEDIUM

BACKGROUND OF THE INVENTION

1. Field of the Invention

The present invention relates to an evaluation method and control method for the imaging performance of a projection optical system, an exposure apparatus having a function which implements the methods, and a memory medium storing a computer program for implementing the methods.

2. Description of the Related Art

An exposure apparatus which projects the pattern of an original onto a substrate, thereby exposing the substrate is used in lithography for manufacturing a device such as a semiconductor device. In recent years, along with further miniaturization of device patterns, a demand for improving the resolution of the exposure apparatus is increasing.

To improve the resolution of the exposure apparatus, the NA of the projection optical system is increasing. These days, an exposure apparatus having an NA of 0.90 or more, and an immersion lithography technique of attaining an effective NA of 1.0 or more by filling the space between the substrate and the final surface of the projection optical system with a medium having a refractive index of 1.0 or more have been put to practical use.

Along with an increase in the NA, the polarization state of incident light on the projection optical system exerts a significant influence on the resolution. Under the circumstance, a technique of controlling the polarization state (the polarization state includes non-polarization in a broad sense) of the incident light has been proposed in order to attain a higher resolution.

However, in practice, optical elements (including optical elements of the projection optical system and illumination optical system, an antireflection film, a reflection film, a reticle, a pellicle, and a resist) which change the polarization state are inserted in the optical path. For this reason, an image may not be formed on the substrate with a targeted polarization state.

Examples of the factors that make the optical elements change the polarization state are the intrinsic birefringences of crystal glass materials, residual stresses imparted to an optical system material, reticle, and substrate upon manufacturing them, stress birefringences generated upon holding them, and polarization differences in the reflection/transmission characteristics of the pellicle, resist, antireflection film, and reflection film.

The polarization state of light which impinges on the object plane of the projection optical system is generally expressed by the Jones vectors or Stokes parameters. Also, a polarization change representing a change in the polarization state of incident light on the projection optical system until it exits from the projection optical system is generally expressed by the Jones matrix or Mueller matrix.

Japanese Patent Laid-Open Nos. 2006-237109 and 2006-173305 disclose techniques of evaluating the influence that the polarization state and polarization change exert on the imaging performance.

The conventional techniques are extremely inefficient because measurement or optical image simulation must be repeated a number of times in order to evaluate the imaging performance of the projection optical system and control the imaging performance of the projection optical system based on the evaluation result.

SUMMARY OF THE INVENTION

The present invention has been made in consideration of the above-described situation, and has as its exemplary object to improve the efficiency of the evaluation of the imaging performance of a projection optical system or the control of the projection optical system based on the evaluation result.

According to the first aspect of the present invention, there is provided an evaluation method of evaluating an imaging performance of a projection optical system which projects a pattern of an original onto a substrate, the method comprising a specifying step of specifying a polarization change of the projection optical system, which represents a relationship between a polarization state of light impinging on the projection optical system and the polarization state of the light exiting from the projection optical system, a first calculation step of calculating a value of a parameter having a correlation with the polarization change of the projection optical system specified in the specifying step, and a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step.

According to the second aspect of the present invention, there is provided a control method of controlling an imaging performance of a projection optical system which projects a pattern of an original onto a substrate, the method comprising a specifying step of specifying a polarization change of the projection optical system, which represents a relationship between a polarization state of light impinging on the projection optical system and the polarization state of the light exiting from the projection optical system, a first calculation step of calculating a value of a parameter having a correlation with the polarization change of the projection optical system specified in the specifying step, a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step, and a control step of controlling the imaging performance of the projection optical system based on the index value calculated in the second calculation step.

According to the third aspect of the present invention, there is provided an exposure apparatus comprising an illumination optical system configured to illuminate an original, a projection optical system configured to project a pattern of the original illuminated by the illumination optical system onto a substrate, and a controller configured to control an imaging performance of the projection optical system, wherein the controller executes a process including a specifying step of specifying a polarization change of the projection optical system, which represents a relationship between a polarization state of light impinging on the projection optical system and the polarization state of the light exiting from the projection optical system, a first calculation step of calculating a value of a parameter having a correlation with the polarization change of the projection optical system specified in the specifying step, a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step, and a control step of controlling the imaging performance of the projection optical system based on the index value calculated in the second calculation step.

According to the fourth aspect of the present invention, there is provided a memory medium storing a computer program for making a computer execute a process for evaluating an imaging performance of a projection optical system which projects a pattern of an original onto a substrate, the medium comprising a specifying step of specifying a polarization change of the projection optical system, which represents a relationship between a polarization state of light impinging on the projection optical system and the polarization state of the light exiting from the projection optical system, a first calculation step of calculating a value of a parameter having a correlation with the polarization change of the projection optical system specified in the specifying step, and a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step.

According to the fifth aspect of the present invention, there is provided a memory medium storing a computer program for making a computer execute a process for evaluating an imaging performance of a projection optical system which projects a pattern of an original onto a substrate, the medium comprising a specifying step of specifying a polarization change of the projection optical system, which represents a relationship between a polarization state of light impinging on the projection optical system and the polarization state of the light exiting from the projection optical system, a first calculation step of calculating a value of a parameter having a correlation with the polarization change of the projection optical system specified in the specifying step, a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step, and a control step of controlling the imaging performance of the projection optical system based on the index value calculated in the second calculation step.

Further features of the present invention will become apparent from the following description of exemplary embodiments with reference to the attached drawings.

DESCRIPTION OF THE EMBODIMENTS

Figure 1A:
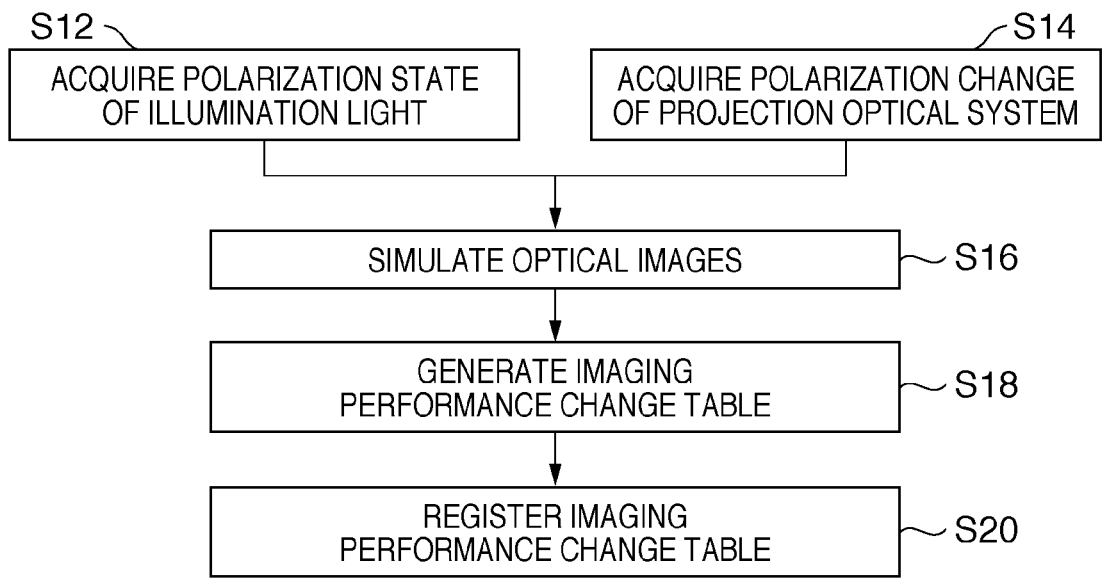
FIG. 1A is a flowchart illustrating the sequence of a process of generation and registration of an imaging performance change table in an exposure system shown in FIG. 3.

Preferred embodiments of the present invention will be described below with reference to the accompanying drawings.

An exposure apparatus projects the pattern of an original (also called a reticle or mask) onto a substrate coated with a photosensitive agent by a projection optical system, thereby forming a latent image on the photosensitive agent. A polarization change of the projection optical system, which represents the relationship between the polarization state of light which impinges on the projection optical system and that of the light which exits from the projection optical system, can be expressed using, for example, a Jones matrix J. The Jones matrix J is given by a complex 2×2 matrix:

$$J = \begin{pmatrix} J_{11} & J_{12} \\ J_{21} & J_{22} \end{pmatrix} \quad (1)$$

where the elements $J_{11}$, $J_{12}$, $J_{21}$, and $J_{22}$ of the Jones matrix J are complex numbers.

The Pauli expansion of the Jones matrix J is given by:

$$J = a_0\sigma_0 + a_1\sigma_1 + a_2\sigma_2 + a_3\sigma_3 \quad (2)$$
$$= \begin{pmatrix} a_0 + a_1 & a_2 - ia_3 \\ a_2 + ia_3 & a_0 - a_1 \end{pmatrix}$$

where i is an imaginary number, $\sigma_0$, $\sigma_1$, $\sigma_2$, and $\sigma_3$ are Pauli spin matrices given by:

$$\sigma_0 = \begin{pmatrix} 1 & 0 \\ 0 & 1 \end{pmatrix} \quad (3)$$
$$\sigma_1 = \begin{pmatrix} 1 & 0 \\ 0 & -1 \end{pmatrix}$$
$$\sigma_2 = \begin{pmatrix} 0 & 1 \\ 1 & 0 \end{pmatrix}$$
$$\sigma_3 = \begin{pmatrix} 0 & -i \\ i & 0 \end{pmatrix}$$

and the Pauli eigen values $a_0$, $a_1$, $a_2$, and $a_3$ are complex numbers. Using the elements of the Jones matrix J, the Pauli eigen values $a_0$, $a_1$, $a_2$, and $a_3$ are given by:

$a_0 = (J_{11} + J_{22})/2$ $a_1 = (J_{11} - J_{22})/2$ $a_2 = (J_{21} + J_{12})/2$ $a_3 = (J_{21} - J_{12})/2i$ \quad (4)

The above description has been given using the commonly-used Pauli expansion method. Note that the phase of light in a perfectly non-polarized state is expressed by the wavefront aberration. For the sake of easy understanding, an expression including polarization-dependent components alone is obtained by removing the phases of light components in a perfectly non-polarized state by normalizing the Jones matrix J. A normalized Jones matrix J' is given by:

$$\phi_0 = \arctan(a_{0i}/a_{0r})$$

$$J' = \exp(-i\phi_0)J \quad (5)$$

where $a_{0r}$ is the real component, and $a_{0i}$ is the imaginary component.

Imaginary components $a'_{0i}$ of Pauli eigen values $a'_0$, $a'_1$, $a'_2$, and $a'_3$ obtained by substituting the Jones matrix J' in relations (4) are zero as given by:

$$a'_{0i} = 0 \quad (6)$$

Because the projection optical system of the exposure apparatus has small phase differences and transmittance differences between polarized light components, we have approximations:

$$a'_{0r} \pm a'_{1i} \approx a'_{0r}$$

$$a'_{0r} \pm a'_{2i} \approx a'_{0r}$$

$$a'_{0r} \pm a'_{3i} \approx a'_{0r}$$

A phase $\phi_{10}$ of a component which is X-polarized when impinging on the projection optical system and remains X-polarized when exiting from the projection optical system, and a phase $\phi_{01}$ of a component which is Y-polarized when impinging on the projection optical system and remains Y-polarized when exiting from the projection optical system are given by:

$$\phi_{10} = \arctan[(a_{0i}+a_{1i})/(a_{0r}+a_{1r})]$$

$$\phi_{01} = \arctan[(a_{0i}-a_{1i})/(a_{0r}-a_{1r})] \quad (8)$$

From relations (6), (7), and (8), we have:

$$\phi_{10} \approx \phi_1 = \arctan(a_{1i}/a_{0r}) \approx -\phi_{01} \quad (9)$$

The phases $\phi_{10}$ and $\phi_{01}$ have opposite signs and can be described by one phase parameter $\phi_1$. The phase parameter $\phi_1$, a parameter $\phi_2$ of 45'-polarized light and 135'-polarized light, and a parameter $\phi_3$ of right-handed circularly polarized light and left-handed circularly polarized light are given by:

$$\phi_1 = \arctan(a_{1i}/a_{0r})$$

$$\phi_2 = \arctan(a_{2i}/a_{0r})$$

$$\phi_3 = \arctan(a_{3i}/a_{0r}) \quad (10)$$

Note that the unit system of the parameters $\phi_1$, $\phi_2$, and $\phi_3$ may be changed to, for example, m/λ by multiplying them by $1000/(2\pi)$.

In this embodiment, the parameters $\phi_1$, $\phi_2$, and $\phi_3$ obtained in the above-described way are expanded by a Zernike series. The Jones matrix J of the projection optical system is expressed as a pupil function. Assume that the pupil coordinates are expressed by a polar coordinate system $(r, \theta)$. Then, the Jones matrix J' is expressed by $J'[r][\theta]$, and, using the pupil coordinates, the parameters $\phi_1$, $\phi_2$, and $\phi_3$ are similarly expressed by $\phi_1[r][\theta]$, $\phi_2[r][\theta]$, and $\phi_3[r][\theta]$.

The Zernike expansions of $\phi_1[r][\theta]$, $\phi_2[r][\theta]$, and $\phi_3[r][\theta]$ are given by:

$$\phi_1[r][\theta] = \sum_i C_{1i} Z_i[r][\theta] \quad (11)$$

$$\phi_2[r][\theta] = \sum_i C_{2i} Z_i[r][\theta]$$

$$\phi_3[r][\theta] = \sum_i C_{3i} Z_i[r][\theta]$$

where $Z_i[r][\theta]$ is the Zernike polynomial, and $C_{1i}$, $C_{2i}$, and $C_{3i}$ are the coefficients of the respective terms of the Zernike polynomial. In one example, the first to ninth terms of the Zernike polynomial are given by:

$$Z_1[r][\theta] = 1$$

$$Z_2[r][\theta] = r \cos \theta$$

$$Z_3[r][\theta] = r \sin \theta$$

$$Z_4[r][\theta] = 2r^2 - 1$$

$$Z_5[r][\theta] = r^2 \cos 2\theta$$

$$Z_6[r][\theta] = r^2 \sin 2\theta$$

$$Z_7[r][\theta] = (3r^3 - 2r) \cos \theta$$

$$Z_8[r][\theta] = (3r^3 - 2r) \sin \theta$$

$$Z_9[r][\theta] = 6r^4 - 6r^2 + 1 \quad (12)$$

A method of expanding the Jones matrix J and a method of expressing the expanded parameters by an orthogonal function have been described above. For the sake of simplicity, the coefficients $C_{1i}$, $C_{2i}$, and $C_{3i}$ obtained by relations (11) will be referred to as Pauli/Zernike coefficients hereinafter.

A method of predicting the imaging performance will be introduced next. To obtain imaging performance characteristics such as the focus, distortion, and the difference (LRCD) between the left CD (Critical Dimension) and the right CD from the data of the Jones matrix J of the projection optical system, imaging performance sensitivities $S_{1i}$, $S_{2i}$, and $S_{3i}$ are calculated in advance by, for example, simulation. The imaging performance sensitivities $S_{1i}$, $S_{2i}$, and $S_{3i}$ represent changes in the imaging performance of the projection optical system in response to changes in the Pauli/Zernike coefficients $C_{1i}$, $C_{2i}$, and $C_{3i}$ by unit amounts.

Although a method of calculating the difference between the left CD and the right CD will be exemplified below, imaging performance characteristics such as the focus and distortion can be calculated in the same way.

First, the normalized Jones matrix J' as given by relations (5) is prepared as a reference. Next, a Jones matrix J" obtained by changing Pauli/Zernike terms, whose imaging performance sensitivities are to be obtained with respect to the Jones matrix J', by unit amounts is generated.

A difference $LRCD_1$ between the left CD and the right CD calculated while the projection optical system is in the state of J', and a difference $LRCD_2$ between the left CD and the right CD calculated while it is in the state of J" are obtained using an optical image simulator. An imaging performance sensitivity $S_{hi}$ of the difference between the left CD and the right CD for a Pauli/Zernike term (h, i) to be obtained is given by:

$$S_{hi} = LRCD_2 - LRCD_1 \quad (13)$$

where the subscript h is the polarized light component number, and i is the Zernike term number. Likewise, imaging performance sensitivities $S_{hi}$ of all Pauli/Zernike terms to be obtained are obtained and tabulated, thereby generating an imaging performance change table. Using the imaging performance sensitivities $S_{hi}$ described in the imaging performance change table, and the Pauli/Zernike coefficients $C_{hi}$ obtained by a polarization change of the projection optical system, an influence LRCD that the polarization change of the projection optical system exerts on the difference between the left CD and the right CD can be calculated by:

$$LRCD = \sum_h \sum_i S_{hi} C_{hi} \qquad (14)$$

Figure 2A:
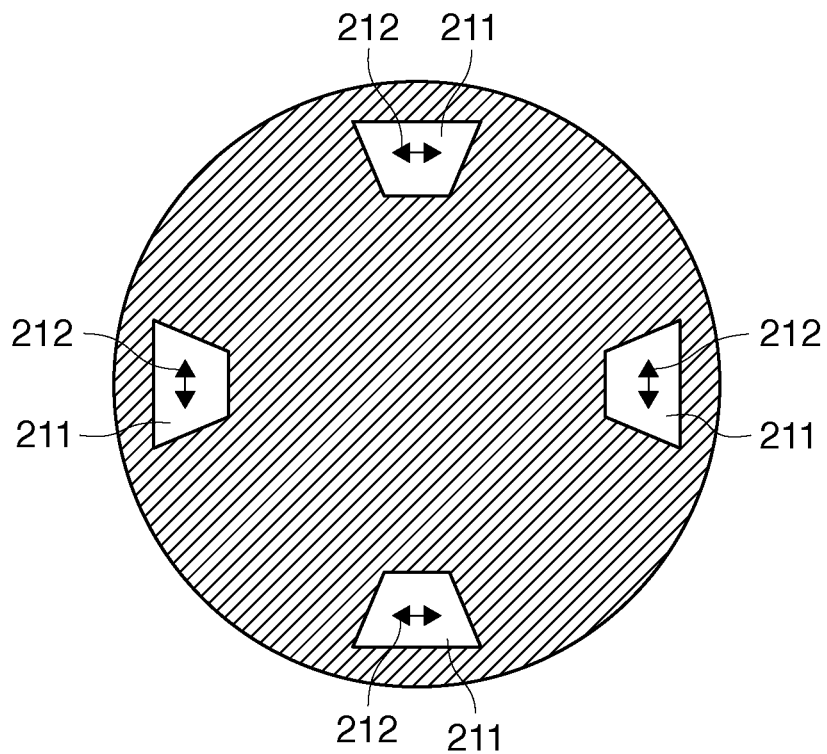
FIG. 2A is a view exemplifying the evaluation condition.
Figure 2B:
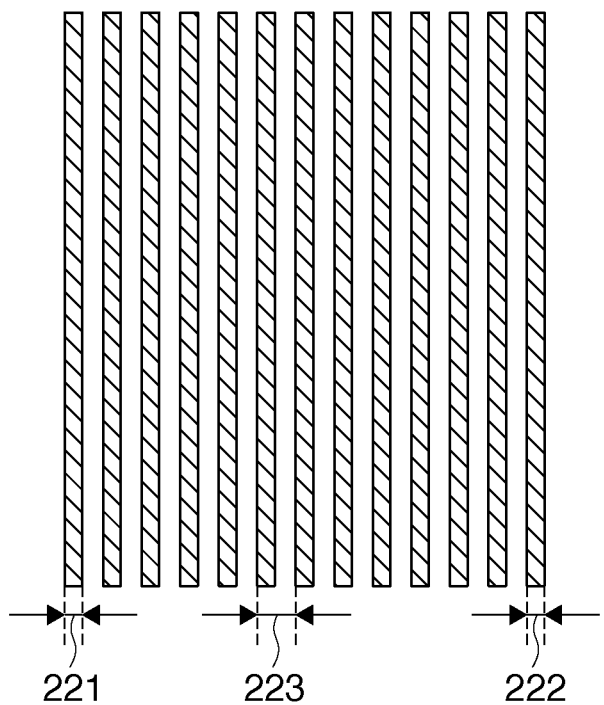
FIG. 2B is a view exemplifying the evaluation condition.
Figure 2C:
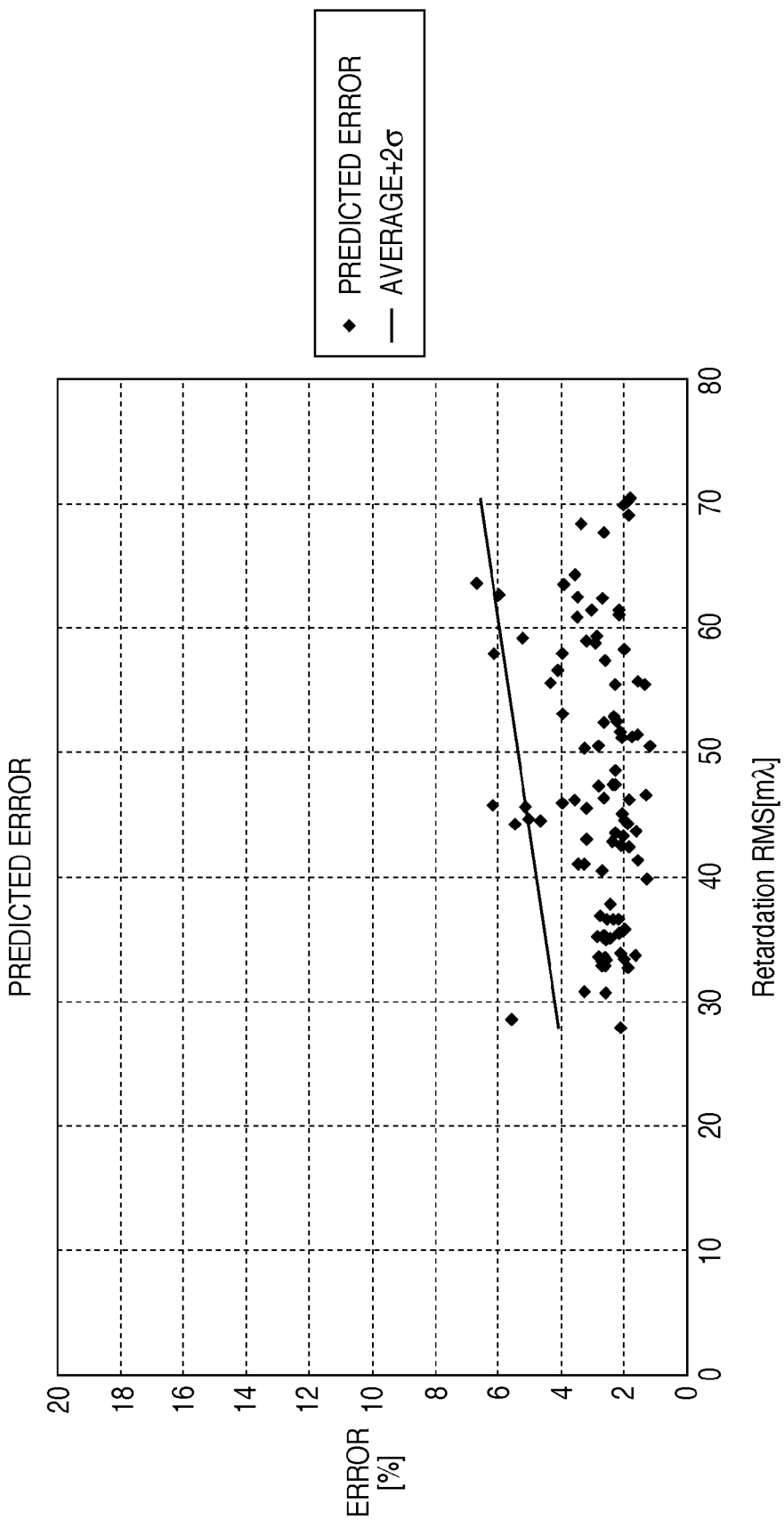
FIG. 2C is a graph exemplifying the evaluation result.

The evaluation accuracy of the above-described evaluation method will be explained. Optical image simulation is used in this evaluation. FIGS. 2A to 2C show an example of the evaluation conditions and the evaluation result. FIG. 2A exemplifies the effective light source, FIG. 2B exemplifies a pattern formed on the image plane of the projection optical system, and FIG. 2C exemplifies the evaluation result. Note that the effective light source means a portion having a light intensity equal to or higher than a predetermined value in the pupil of an illumination optical system which illuminates an original (reticle).

Quadrupole illumination having poles 211 with four light intensities is employed in this evaluation, as shown in FIG. 2A. The polarization state is tangential polarization having, at the center of each pole, a polarization direction tangential to the circumferential direction about the pupil center, as indicated by arrows 212. More specifically, this illumination is quadrupole illumination which has poles in the 0°, 90°, 180°, and 270° directions and is formed by extracting from an annular light intensity distribution. In this illumination, the outer σ is 0.95, the inner σ is 0.75, and the extraction angle is 30°.

As exemplified in FIG. 2B, a pattern formed on the image plane of the projection optical system has 13 repetitive lines, in which the average of critical dimensions 221 and 222 is 65 nm, and a repetition cycle 223 is 130 nm. The imaging performance characteristic of interest is the difference between the left CD and the right CD as the difference between the critical dimensions 221 and 222.

In the evaluation result shown in FIG. 2C, the abscissa indicates the root-mean-square of the birefringence amount in the pupil of the projection optical system, and the ordinate indicates the error. Letting LRCDjm be the value of the difference between the left CD and the right CD obtained directly from the Jones matrix, and LRCDpz be the value of the difference between the left CD and the right CD derived from relations (1) to (14), the error is given by:

$$\text{error}=|(LRCDpz-LRCDjm)/LRCDjm|*100[\%] \qquad (15)$$

The dots in FIG. 2C are obtained by plotting the errors due to various types of birefringences, and the straight line in the graph of FIG. 2C is obtained by statistically processing the dots and connecting the values of (error average)+2σ.

The root-mean-square of the general birefringence amount of the exposure apparatus is about 30 mλ, and the value of (error average)+2σ in this case is 5% or less. As is obvious from this fact, the imaging performance derived from relations (1) to (14) matches an actual imaging performance with high accuracy.

A method of predicting polarization-dependent components of the aberration of the projection optical system has been described above. The wavefront aberration of the projection optical system can also be assumed as one polarized light component and evaluated using the Zernike coefficient $C_{hi}$ of the measured wavefront aberration, and the imaging performance sensitivity $S_{hi}$ attributed to the wavefront aberration by a relation similar to relation (14).

Moreover, an aberration controller can control the wavefront aberration so that the LRCD given by relation (14) becomes a desired value. Japanese Patent Laid-Open No. 2004-347821 discloses details of the aberration controller.

The Jones matrix J' serving as a reference desirably exhibits a real polarization change of the projection optical system. However, it is possible to determine the imaging performance sensitivity with high accuracy even by using design data or a Jones matrix J' when the projection optical system has no aberration in order to save troubles involved.

To obtain the imaging performance sensitivity by optical image simulation, it is necessary to designate the polarization state of the effective light source. At this time, the polarization state of the illumination light is desirably measured and designated. However, it is possible to determine the imaging performance sensitivity with high accuracy even by using a design value or an ideal polarization state in order to save troubles involved as long as the polarization state of the illumination light falls within an allowance.

Although the imaging performance sensitivities given by relations (10) and (11) exemplify those obtained by linear approximation, a sensitivity table using a cubic function or other functions may be exploited.

The Jones matrix, Pauli expansion, and Zernike polynomial are used as a preferable embodiment of the evaluation herein. However, Pauli expansion and Zernike polynomial need not always be used as long as the imaging performance is evaluated by separating a polarization change for each polarized light component and expressing the separated polarization change using an orthogonal function system.

Figure 3:
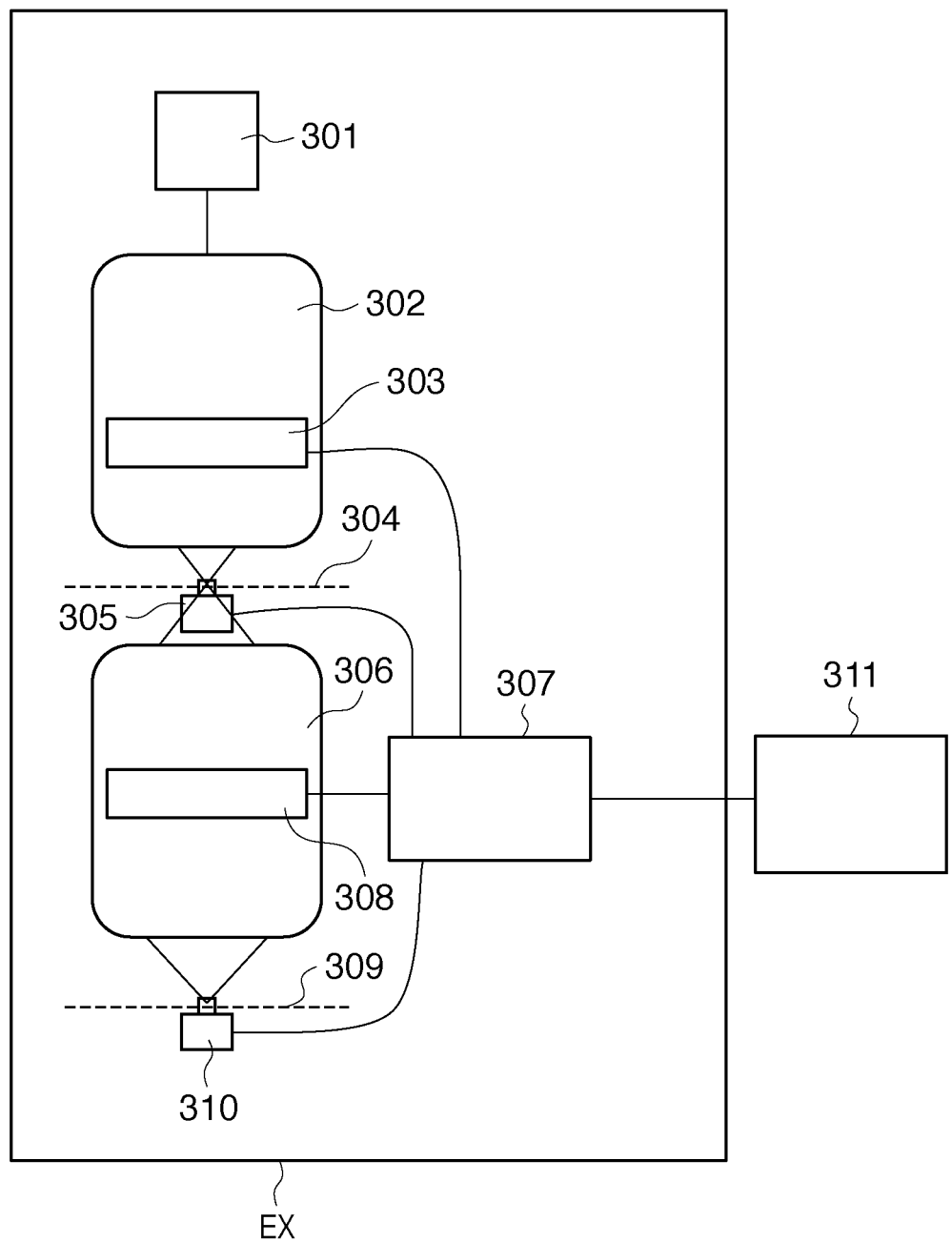
FIG. 3 is a view showing the schematic arrangement of an exposure system according to a preferred embodiment of the present invention.
Figure 4:
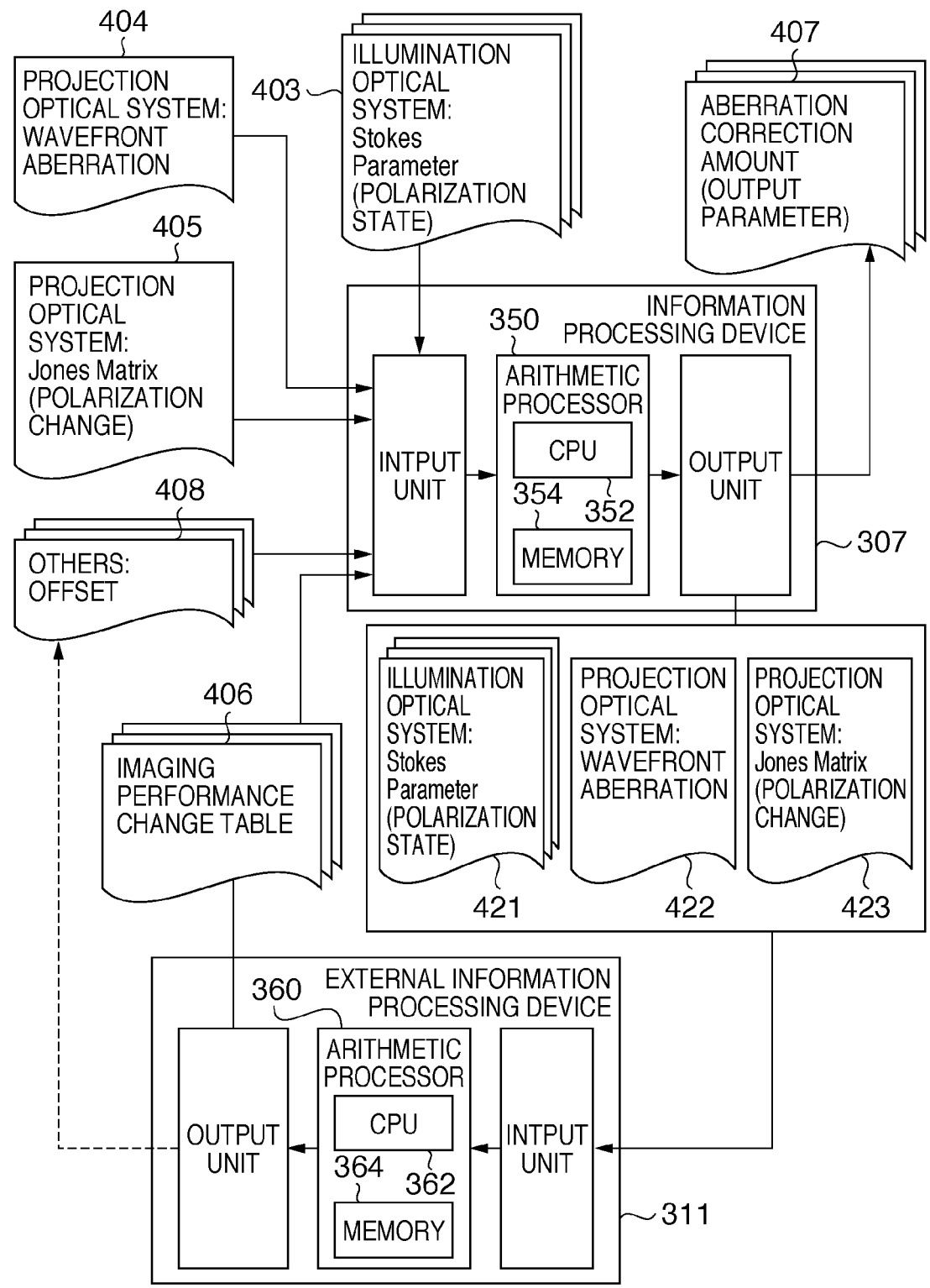
FIG. 4 is a block diagram schematically showing the flow of pieces of information in the exposure system shown in FIG. 3.

FIG. 3 is a view showing the schematic arrangement of an exposure system according to a preferred embodiment of the present invention. FIG. 4 is a block diagram schematically showing the flow of pieces of information in the exposure system shown in FIG. 3. The exposure system can include an exposure apparatus EX and external information processing device 311.

The exposure apparatus EX can include a light source 301, an illumination optical system 302, a projection optical system 306, an original stage mechanism (not shown) for inserting an original (reticle) onto an object plane 304 of the projection optical system 306, and a substrate stage mechanism (not shown) for inserting a substrate onto an image plane 309 of the projection optical system 306. The light source 301 can be, for example, an excimer laser such as an ArF, KrF, or $F_2$ excimer laser, an EUV light source, or a lamp such as an i-line lamp or g-line lamp. Using light emitted by the light source 301, the illumination optical system 302 generates a targeted effective light source (a light intensity distribution on the pupil plane), and a polarizer 303 controls its polarization state. The original inserted on the object plane 304 of the projection optical system 306 is illuminated with the light which exits from the illumination optical system 302.

The pattern of the original inserted on the object plane 304 of the projection optical system 306 is projected onto the substrate inserted on the image plane 309 of the projection optical system 306 by the projection optical system 306. With this operation, the photosensitive agent applied on the substrate is exposed.

The exposure apparatus can include a measurement device 305 for measuring the polarization state of illumination light which illuminates the object plane 304 to insert the original. The measurement device 305 sends, as the measurement result, information 403 representing the polarization state of illumination light formed by the illumination optical system 302 to an information processing device 307.

The exposure apparatus can include a measurement device 310 for measuring the polarization state of light which impinges on the image plane 309 to insert the substrate, and the wavefront aberration of the projection optical system 306. The polarization state of light which impinges on the image plane 309 can be assumed as that of light which exits from the projection optical system 306. The measurement device 310 sends, as the measurement result, information 404 representing the wavefront aberration of the projection optical system 306, and information 405 representing a polarization change of the projection optical system 306 to the information processing device (which can also be interpreted as a controller or computer) 307.

The information processing device 307 specifies a polarization state 421 of illumination light with which the illumination optical system 302 illuminates the object plane of the projection optical system 306, based on the information 403 sent from the measurement device 305. The information processing device 307 specifies a polarization change 423 of the projection optical system 306, based on the information 405 sent from the measurement device 310. Although the polarization change 423 is preferably expressed by the Jones matrix J as described above, it may also be expressed by, for example, the Mueller matrix. The information processing device 307 specifies a wavefront aberration 422 of the projection optical system 306, based on the information 404 sent from the measurement device 310.

The information processing device 307 calculates an index value (for example, LRCD described previously) representing the imaging performance of the projection optical system 306 while the projection optical system 306 has the specified polarization change, based on the values of parameters (for example, the values of the Pauli/Zernike coefficients $C_{1i}$, $C_{2i}$, and $C_{3i}$ described previously) having a correlation with the specified polarization change, and an imaging performance change table 406 which can be provided from the external information processing device (computer) 311.

The imaging performance change table 406 is a table which describes the amount of change in the index value representing the imaging performance of the projection optical system 306 upon changing the values of parameters (for example, the values of the Pauli/Zernike coefficients $C_{1i}$, $C_{2i}$, and $C_{3i}$ described previously) having a correlation with a polarization change of the projection optical system 306 by unit amounts (for example, $S_{hi}$=LRCD$_2$−LRCD$_1$ described previously).

The information processing device 307 determines an aberration correction amount 407 based on an index value (for example, LRCD described previously) representing the imaging performance of the projection optical system 306, and operates the aberration controller of the projection optical system 306 in accordance with the aberration correction amount 407, thereby controlling the imaging performance of the projection optical system 306.

The external information processing device 311 calculates, by optical image simulation, a first index value (for example, LRCD$_1$ described previously) representing the imaging performance of the projection optical system 306 when the value of a parameter having a correlation with a polarization change of the projection optical system 306 is a first value (for example, J' described previously). Also, the external information processing device 311 calculates, by optical image simulation, a second index value (for example, LRCD$_2$ described previously) representing the imaging performance of the projection optical system 306 when the value of the parameter is a second value (for example, J" described previously) which differs from the first value by a unit amount. Then, the external information processing device 311 calculates the difference between the first index value and the second index value, and determines the calculated difference as the amount of change in the index value $S_{hi}$. The external information processing device 311 tabulates the determined amount of change in the index value $S_{hi}$ as the imaging performance change table 406, and registers it in a memory 364. The imaging performance change table 406 is provided from the external information processing device 311 to the information processing device 307.

FIG. 1A is a flowchart illustrating the sequence of a process of generation and registration of an imaging performance change table in the exposure system shown in FIG. 3. The process shown in FIG. 1A can be controlled by an arithmetic processor 360 of the external information processing device 311. The arithmetic processor 360 can execute the process shown in FIG. 1A as a CPU 362 operates based on a computer program loaded in the memory 364.

In step S12, the external information processing device 311 acquires a polarization state 421 of illumination light with which the illumination optical system 302 illuminates the object plane of the projection optical system 306. In step S14, the external information processing device 311 acquires a polarization change 423 of the projection optical system 306 from the information processing device 307.

In step S16, the external information processing device 311 executes optical image simulation based on the polarization state 421 and polarization change 423. More specifically, the external information processing device 311 simulates an optical image formed on the image plane of the projection optical system 306 when the value of a parameter having a correlation with a polarization change of the projection optical system 306 is a first value (for example, is expressed by J' described previously). Also, the external information processing device 311 simulates an optical image formed on the image plane of the projection optical system 306 when the value of the parameter is a second value (for example, is expressed by J" described previously) which differs from the first value by a unit amount.

In step S18 (determination step), the external information processing device 311 calculates the difference between a first index value (for example, LRCD$_1$ described previously) and a second index value (for example, LRCD$_2$ described previously) based on the optical image simulation result obtained in step S16, and determines the calculated difference as the amount of change in the index value (for example, $S_{hi}$ described previously). Then, the external information processing device 311 generates an imaging performance change table 406 obtained by tabulating the amount of change in the index value (for example, $S_{hi}$ described previously).

In step S20, the external information processing device 311 registers the imaging performance change table 406 (the amount of change in the index value) generated in step S18 in the memory 364.

After the imaging performance change table 406 is generated, it need not be updated as long as the polarization state of the illumination light falls within an allowance. After the imaging performance change table 406 is provided from the external information processing device 311 to the information processing device 307 of the exposure apparatus EX, the measurement device 310 can be detached from the exposure apparatus EX.

Figure 1B:
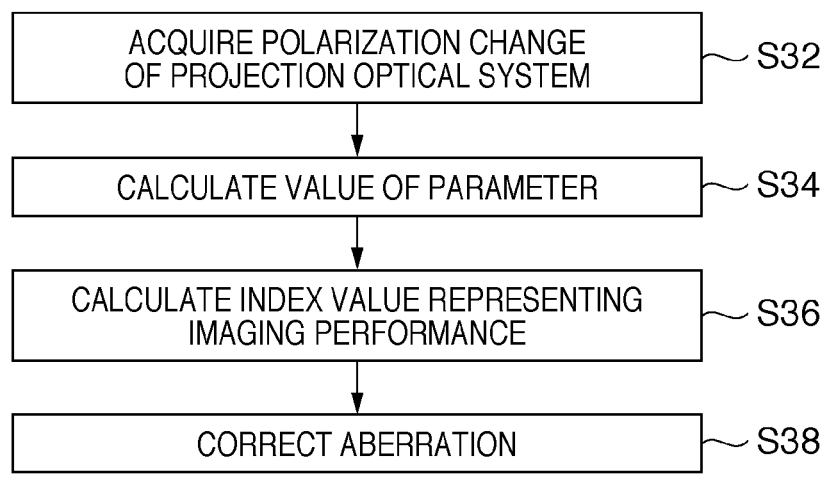
FIG. 1B is a flowchart illustrating the sequence of a process of imaging performance calculation and aberration control in the exposure system shown in FIG. 3.

FIG. 1B is a flowchart illustrating the sequence of a process of imaging performance calculation and aberration control in the exposure system shown in FIG. 3. The process shown in FIG. 1B can be controlled by an arithmetic processor 350 of the information processing device 307. The arithmetic processor 350 can execute the process shown in FIG. 1B as a CPU 352 operates based on a computer program loaded in a memory 354.

The computer programs loaded in the memories 364 and 354 can be provided as a single computer program or separate computer programs. The processes shown in FIGS. 1A and 1B may be controlled by a single information processing device or a plurality of information processing devices.

In step S32 (specifying step), the information processing device 307 specifies a polarization change 423 of the projection optical system 306 based on information 405 sent from the measurement device 310.

In step S34 (first calculation step), the information processing device 307 calculates the value of a parameter having a correlation with the polarization change 423 specified in step S32.

In step S36 (second calculation step), the information processing device 307 calculates an index value representing the imaging performance of the projection optical system 306 while the projection optical system 306 has the specified polarization change, based on an imaging performance change table 406 and the value of the parameter calculated in step S34.

In step S38 (control step), the information processing device 307 determines an aberration correction amount 407 based on the index value representing the imaging performance of the projection optical system 306, and operates the aberration controller of the projection optical system 306 in accordance with the aberration correction amount 407. With this operation, the imaging performance of the projection optical system 306 is controlled.

Note that a targeted imaging performance may not be attained due to the influence of, for example, a measurement error or calculation error. To cope with this situation, a function which takes account of offset data 408 can be imparted to the information processing device 307 to allow further fine control of the projection optical system 306.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-003641, filed Jan. 10, 2008, which is hereby incorporated by reference herein in its entirety.

What is claimed is:

1. A method of evaluating an imaging performance of a projection optical system which projects a pattern of an original onto a substrate, the method comprising:
   a specifying step of specifying, by a computer, a polarization change of the projection optical system, which represents a relationship between a polarization state of light impinging on the projection optical system and the polarization state of the light exiting from the projection optical system;
   a first calculation step of calculating, by a computer, a value of a parameter having a correlation with the polarization change of the projection optical system specified in the specifying step; and
   a second calculation step of calculating, by a computer, an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step,
   wherein the parameter whose value is calculated in the first calculation step includes a phase of light passing through the projection optical system, the phase being calculated based on the polarization change of the projection optical system,
   wherein the polarization change of the projection optical system is expressed by a Jones matrix, and the value of the parameter is obtained based on an eigen value obtained by Pauli expansion of the Jones matrix, and
   wherein the value of the phase is obtained based on an eigen value obtained by Pauli expansion of the Jones matrix, and the phase is given by an arctangent function of the eigen value.

2. The method according to claim 1, further comprising:
   a determination step of determining, as the amount of change in the index value, a difference between a first index value representing the imaging performance of the projection optical system when the value of the parameter is a first value, and a second index value representing the imaging performance of the projection optical system when the value of the parameter is a second value which differs from the first value by a unit amount; and
   a registration step of registering the amount of change in the index value determined in the determination step in a memory, wherein in the second calculation step, the amount of change in the index value registered in the memory is referred to.

3. The method according to claim 2, wherein in the determination step, the first index value is calculated using a value of the parameter when the projection optical system has no aberration as the first value.

4. The method according to claim 2, wherein in the determination step, the first index value is calculated using a value obtained based on measurement as the first value.

5. The method according to claim 1, wherein the polarization change of the projection optical system is expressed by a Jones matrix, and the value of the parameter is obtained by the Jones matrix.

6. A control method of controlling an imaging performance of a projection optical system which projects a pattern of an original onto a substrate, the method comprising:
   a specifying step of specifying a polarization change of the projection optical system, which represents a relationship between a polarization state of light impinging on the projection optical system and the polarization state of the light exiting from the projection optical system;
   a first calculation step of calculating a value of a parameter having a correlation with the polarization change of the projection optical system specified in the specifying step;
   a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step; and a control step of controlling the imaging performance of the projection optical system based on the index value calculated in the second calculation step, wherein the parameter whose value is calculated in the first calculation step includes a phase of light passing through the projection optical system, the phase being calculated based on the polarization change of the projection optical system, wherein the polarization change of the projection optical system is expressed by a Jones matrix, and the value of the parameter is obtained based on an eigen value obtained by Pauli expansion of the Jones matrix, and wherein the value of the phase is obtained based on an eigen value obtained by Pauli expansion of the Jones matrix, and the phase is given by an arctangent function of the eigen value.

7. An exposure apparatus comprising:

an illumination optical system configured to illuminate an original;

a projection optical system configured to project a pattern of the original illuminated by said illumination optical system onto a substrate; and a controller configured to control an imaging performance of said projection optical system, wherein said controller executes a process including a specifying step of specifying a polarization change of said projection optical system, which represents a relationship between a polarization state of light impinging on said projection optical system and the polarization state of the light exiting from said projection optical system, a first calculation step of calculating a value of a parameter having a correlation with the polarization change of said projection optical system specified in the specifying step, a second calculation step of calculating an index value representing the imaging performance of said projection optical system in a state that said projection optical system has the polarization change specified in the specifying step, based on an amount of change in the index value representing the imaging performance of said projection optical system upon changing the value of the parameter by a unit amount, and the value of the parameter calculated in the first calculation step, and a control step of controlling the imaging performance of said projection optical system based on the index value calculated in the second calculation step, wherein the parameter whose value is calculated in the first calculation step includes a phase of light passing through the projection optical system, the phase being calculated based on the polarization change of the projection optical system, wherein the polarization change of the projection optical system is expressed by a Jones matrix, and the value of the parameter is obtained based on an eigen value obtained by Pauli expansion of the Jones matrix, and wherein the value of the phase is obtained based on an eigen value obtained by Pauli expansion of the Jones matrix, and the phase is given by an arctangent function of the eigen value.

8. A non-transitory computer readable medium storing a computer program for making a computer execute a process for evaluating an imaging performance of a projection optical system which projects a pattern of an original onto a substrate, the medium comprising:

a specifying step of specifying a polarization change of the projection optical system, which represents a relationship between a polarization state of light impinging on the projection optical system and the polarization state of the light exiting from the projection optical system;

a first calculation step of calculating a value of a parameter having a correlation with the polarization change of the projection optical system specified in the specifying step; and a second calculation step of calculating an index value representing the imaging performance of the projection optical system in a state that the projection optical system has the polarization change specified in the specifying step, based on an amount of change in the index value representing the imaging performance of the projection optical system upon changing the value of the parameter by a unit amount, and the value of the parameter calculated in the first calculation step, wherein the parameter whose value is calculated in the first calculation step includes a phase of light passing through the projection optical system, the phase being calculated based on the polarization change of the projection optical system, wherein the polarization change of the projection optical system is expressed by a Jones matrix, and the value of the parameter is obtained based on an eigen value obtained by Pauli expansion of the Jones matrix, and wherein the value of the phase is obtained based on an eigen value obtained by Pauli expansion of the Jones matrix, and the phase is given by an arctangent function of the eigen value.

9. The method according to claim 8, further comprising:

a control step of controlling the imaging performance of the projection optical system based on the index value calculated in the second calculation step.

* * * * *